April 15, 1969 G. R. CARLSON 3,439,284
TRANSFORMERLESS PUSH-PULL AMPLIFIER WITH ADJUSTABLE CLASS OF OPERATION
Filed Oct. 19, 1965
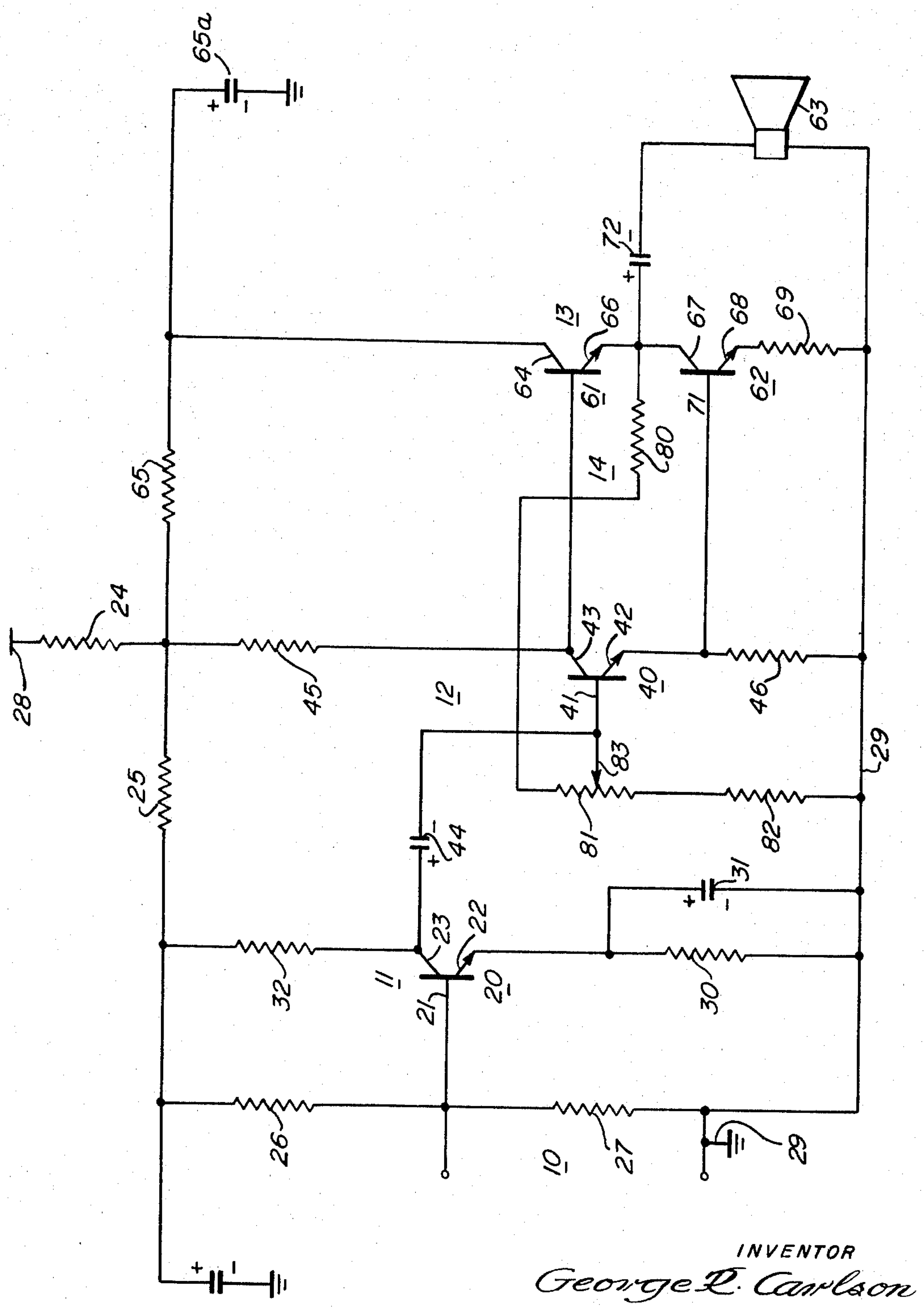
INVENTOR
George R. Carlson
BY Hofgren, Wegner, Allen, Stellman & McCord
ATTORNEYS 3,439,284
TRANSFORMERLESS PUSH-PULL AMPLIFIER WITH ADJUSTABLE CLASS OF OPERATION

George R. Carlson, Winnetka, Ill., assignor to Warwick Electronics Inc., a corporation of Delaware Filed Oct. 19, 1965, Ser. No. 498,072
Int. Cl. H03f *3/26*; H03g *3/30*
U.S. Cl. 330—15 1 Claim

ABSTRACT OF THE DISCLOSURE

A transformerless amplifier which has a driver transistor with collector and emitter output elements and a push-pull output circuit including a pair of transistors, both of the same conductivity, wherein the pair of transistors are connected in series, emitter to collector. The base elements of the output transistors are respectively coupled to the emitter and collector loads of the driver transistor and the output is taken at the junction between the output transistors. A variable DC feedback is coupled between the output and the base of the driver transistor to stabilize the amplifier and enable the manual selection of the class of operation of the push-pull output stage.

This invention relates to a transformerless amplifier circuit and more specifically to a transformerless push-pull transistor amplifier circuit.

In push-pull amplifiers a transformer is customarily used to obtain the two drive signals for the output amplifier. Transformers are expensive, bulky, susceptible to failure, and limit an amplifier's low frequency response.

An object of this invention is to eliminate such transformer coupling.

A further object of this invention is to provide direct current drive to both output transistors.

Another object of this invention is to minimize cost and to improve reliability and durability.

One feature of the invention is the provision of an amplifier including a driver transistor having collector and emitter output elements and a push-pull output circuit including a pair of transistors, both of the same conductivity type as the driver transistor with the base element of each direct current connected with the output of the driver and the collector-emitter output circuits connected in series. The load is connected across one of the output transistors.

Another feature of the invention is the provision of a third direct current circuit connecting the emitter output elements of one output transistor (and the collector of the other output transistor) to the base input element of the driver transistor for direct current stabilization. This third direct current circuit can be made variable to set the output stages for class A, A–B, or B operation.

Further objects and advantages will become apparent in the following specification and drawing in which the figure is a schematic diagram of a circuit embodying the invention.

While this invention is susceptible of embodiment in many different forms, there is shown an the drawing and will herein be described in detail an embodiment of the invention with the understanding that the present disclosure is to be considered as an exemplification of the principles of the invention and is not intended to limit the invention to the embodiment illustrated. The scope of the invention will be pointed out in the appended claims.

During the course of the description, specific values and types will be given for the various components. This detailed information is given to illustrate an operative embodiment of the invention and the values are not to be considered critical unless specifically so stated.

Referring now to the figure, there is shown a source of signal 10, an amplifier stage 11, a driver stage 12, an output stage 13, and a feedback circuit 14.

The amplifier stage 11 consists of a silicon transistor 20, TI416, having base 21, emitter 22 and collector 23 elements. The signal from source 10 is applied to the base input element 21 of transistor 20. Bias for the base input element 21 is supplied by a voltage dividing network consisting of resistors 24, 25, 26, 27, whose values are 100 ohms, 10,000 ohms, 47,000 ohms and 10,000 ohms respectively. The voltage dividing network is connected between a source of positive potential 28 and a reference or ground 29, and the base input element 21 is connected to the junction of resistors 26 and 27.

The emitter output element 22 is returned through a resistor 30, 1,000 ohms, bypassed by a capacitor 31 15 $\mu$f., to ground 29. The collector output element 23 is coupled through load resistor 32, 3300 ohms, to the voltage dividing circuit at the junction of resistors 25 and 26.

Driver stage 12 includes a driver phase-splitter transistor 40, 2N3567, which has a single ended base input element 41, and emitter 42 and collector 43 output elements. The base input element 41 of the driver transistor 40 is connected to the collector output element 23 of the amplifier transistor 20 by means of a capacitor 44, 15 $\mu$f. The collector output element 43 is coupled through load resistor 45, 1500 ohms, to the voltage dividing network at the junction of resistors 25 and 24. The emitter electrode is returned through load resistor 46, 68 ohms, to ground 29.

Output stage 13 includes a pair of output transistors 61 and 62 driven in phase opposition, providing a push-pull drive to the speaker load 63. Transistor 61, an emitter follower, may be a Fairchild 2N3567 while transistor 62 may be either a Fairchild SE8002 or a Raytheon RT9101. Both transistors 61 and 62 are of the same conductivity type as driver transistor 40. Although all the transistors are shown as NPN devices, it is to be understood that with the proper attention being paid to the biasing conditions, PNP devices may be used.

The collector 64 of transistor 61 is connected through resistor 65, 82 ohms, to the junction of resistors 25 and 24, and is returned to ground for AC through capacitor 65*a*, 200 $\mu$f., for grounded collector operation. The emitter 66 of transistor 61 and the collector 67 of transistor 62 are connected together while the emitter 68 of transistor 62 is returned through resistor 69, 4.7 ohms, to ground 29. The input to base 70 of transistor 61 is derived from collector output element 43 of driver transistor 40, across resistor 45. The input to base 71 is obtained across resistor 46, from the emitter output element 42 of driver transistor 40. The load circuit, including D.C. blocking capacitor 72, 50 $\mu$f., and speaker 63 is connected from the junction of emitter output element 66 with collector output element 67 to ground 29, across transistor 62.

Feedback circuit 14 includes resistor 80, 47,000 ohms, potentiometer 81, 5000 ohms, and resistor 82, 2200 ohms. The feedback resistors are connected in series from the junction of emitter output element 66 with collector output element 67 and ground 29. Tap 83 on resistor 81 is connected to the base input element 41 of driver transistor 40, providing adjustable bias and feedback.

The output of the collector element 43 of driver transistor 40 has a relatively high impedance which matches the high input impedance of transistor 61 which is connected in an emitter follower configuration. The output from the emitter element 42 of the driver transistor 40 has a low impedance which matches the low input impedance of transistor 62. Since the driver transistor and the two output transistors 61 and 62 are of the same conductivity type, direct current coupling between the driver and output transistors is possible. This greatly reduces the number of components required.

Driver transistor 40 is a voltage amplifier while output transistor 61 acts as an emitter follower for the speaker load. When transistor 61 is driven toward cutoff, output transistor 62 supplies the current to maintain the drive to the speaker load. The feedback circuit 14, coupled between the point at which the emitter 66 and collector 67 output elements of the output transistors are tied together in the push-pull circuit and the base input circuit 21 of the driver transistor, provides direct current stability in the output circuit.

The amplifier can be operated in the straight class A mode. It can also be operated in class A–B or class B mode with reduced power dissipation.

This amplifier has been operated to provide in excess of one watt of audio into a speaker load of 60 to 80 ohms at a total harmonic distortion of 4 to 6 percent. The input voltage sensitivity is about 1.2 volts p–p for one watt output. Moreover, the over-all gain is almost independent of the beta parameter of the transistors.

The efficiency of the circuit approaches that of a transformer circuit but without the cost of a transformer and with a minimum of biasing and coupling components.

I claim:

1. A transformerless amplifier, comprising: a source of signals; a source of operating potential with respect to a reference potential; a driver transistor having a base input element coupled with said signal source and a collector-emitter output circuit connected across said source of operating potential, said output circuit including impedance load elements between each of the collector and emitter elements and the source of operating potential; a push-pull output circuit including a pair of transistors, both of the same conductivity type as the driver transistor and each having base, collector and emitter elements, the collector-emitter circuits of said pair of transistors being connected in series across the source of operating potential; a first direct current circuit connecting the base of one of said pair of transistors with one of said impedance load elements; a second direct current circuit connecting the base element of the other of said output transistors with the other of said impedance load elements; a third direct current circuit including variable resistive means having a variable output element, connecting the junction of said pair of output transistors and said source of reference potential, said variable output element connected to said base input element of the driver transistor; and means connecting said load between the junction of said pair of output transistors and said source of operating potential.

References Cited

UNITED STATES PATENTS

| | | | |
|---|---|---|---|
| 2,762,874 | 9/1956 | Barco | 330—14 |
| 2,860,195 | 11/1958 | Stanley | 330—14 X |
| 3,246,251 | 4/1966 | Sheppard | 330—15 X |
| 3,320,543 | 5/1967 | Hopengarten et al. | 330—15 |

ROY LAKE, *Primary Examiner.*

SIEGFRIED H. GRIMM, *Assistant Examiner.*

U.S. Cl. X.R.

330—25